United States Patent
Eppley

(10) Patent No.: US 7,195,932 B1
(45) Date of Patent: Mar. 27, 2007

(54) ENHANCEMENT OF GRAIN STRUCTURE FOR TUNGSTEN CONTRACTS

(75) Inventor: Amos Eppley, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 260 days.

(21) Appl. No.: 10/915,646

(22) Filed: Aug. 9, 2004

(51) Int. Cl.
   *H01L 21/66* (2006.01)
(52) U.S. Cl. .......................... 438/14; 438/15; 438/685
(58) Field of Classification Search ................ 438/14, 438/15, 16, 689, 696, 785
   See application file for complete search history.

(56) References Cited

U.S. PATENT DOCUMENTS

2002/0176972 A1 * 11/2002 Tsai .......................... 428/200
2003/0097888 A1 * 5/2003 Hirose et al. ................. 73/863
2004/0087146 A1 * 5/2004 Paterson ..................... 438/687
2004/0242018 A1 * 12/2004 Rusli ......................... 438/754

* cited by examiner

*Primary Examiner*—Tuan H. Nguyen
(74) *Attorney, Agent, or Firm*—Martine Penilla & Gencarella, LLP

(57) ABSTRACT

A method for enhancing grain structure of a contact material for a semiconductor device is provided. The method initiates with exposing the contact material of a contact at a first depth within the semiconductor device. Then, the exposed contact material at the first depth is coated. In one embodiment, the exposed contact material is coated via a voltage potential driven energy. The coated material is then removed, thereby exposing the contact material at a second depth within the semiconductor device. Then, the exposed material at the second depth is coated.

8 Claims, 5 Drawing Sheets

ENHANCEMENT OF GRAIN STRUCTURE FOR TUNGSTEN CONTRACTS

BACKGROUND OF THE INVENTION

1. Field of the Invention

This invention relates generally to semiconductor manufacturing and, in particular, to preparing a cross section of a semiconductor chip for analysis.

2. Description of the Related Art

Failure analysis and sample preparation is an important tool in providing a detailed inspection of the physical characteristics of an integrated circuit (IC) fabricated on a semiconductor chip (IC chip). With the structure of integrated circuits decreasing in size and becoming more complex, electron microscopy has emerged as a critical tool for highly site-specific failure analysis. More particularly, an important issue is the analysis of via and contact failure between layers in an integrated circuit, which is one of the most common inspections in semiconductor manufacturing.

Physical characteristics of via and contact plugs provide critical factors in determining the overall performance of an IC chip. These physical characteristics are directly linked to the properties related to electrical conductivity of the via and contact plug. Some critical factors for via and contact properties include grain structure, barrier metal layer coverage and plug critical dimensions.

One important aspect of the failure analysis is to be able to gauge process integrity through images taken by a high resolution stereo scanning microscope. However, current techniques for preparing the sample tend to mask the textural properties, i.e., grain structure, of the feature by smearing the interconnect. Reactive Ion Etching (RIE) is one technique that may be used to prepare the sample. One shortcoming of RIE is that RIE requires hazardous chemicals as well as fume hoods. Of course, the chemicals must be disposed of once used. Thus, the current techniques for viewing the grain structure of an interconnect is expensive and hazardous.

As a result, there is a need to solve the problems of the prior art to safely and inexpensively evaluate the structural integrity of contacts of a semiconductor device.

SUMMARY OF THE INVENTION

Broadly speaking, the present invention fills these needs by providing a method and apparatus for enhancing the grain structure of a contact for subsequent viewing. It should be appreciated that the present invention can be implemented in numerous ways, including as a method, a system, or an apparatus. Several inventive embodiments of the present invention are described below.

In one embodiment, a method for enhancing grain structure of a contact material for a semiconductor device is provided. The method initiates with exposing the contact material of a contact at a first depth within the semiconductor device. Then, the exposed contact material at the first depth is coated. In one embodiment, the exposed contact material is coated via a voltage potential driven energy. The coated material is then removed, thereby exposing the contact material at a second depth within the semiconductor device. Then, the exposed material at the second depth is coated.

In another embodiment, a method for cross-sectioning a semiconductor device that minimizes smearing of a grain structure within a feature of the semiconductor device is provided. The method initiates with performing a first cut into the feature. Then, a conductive coating is applied to an exposed surface of the feature. After applying the conductive coating, a second cut extending past the exposed surface into the feature is made. Then, a surface topography is defined on a surface resulting from the second cut.

In yet another embodiment, a method for preparing a cross section of a semiconductor device in a manner that preserves a grain structure of a feature within the semiconductor device is provided. The method initiates with grinding the cross section of the semiconductor device to expose a first surface of the feature. Then, a first conductive coating layer is disposed over the first surface in the presence of voltage potential driven energy. Next, the conductive coating layer is ground to a second surface within the feature that is past the first surface. Then, a second conductive coating layer is disposed over the second surface.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for an apparatus and method for preparing a cross section of a semiconductor device for failure analysis. It will be obvious, however, to one skilled in the art, that the present invention may be practiced without some or all of these specific details. In other instances, well known process operations have not been described in detail in order not to unnecessarily obscure the present invention.

A technique for preparing a sample to be analyzed through scanning electron microscopy is provided. The technique performs a first cut into the feature material. The exposed surface is then coated with a conductive layer, such as gold palladium. The conductive layer is applied to the exposed surface through a voltage potential driven energy, e.g., via a sputter coater. A second cut is then performed removing the coated layer and cutting further into the feature material. The sample surface is decorated and then a conductive coating is applied. Thereafter, the sample is analyzed through scanning electron microscopy. Since the grain structure is visible through this preparation technique, the effectiveness of the manufacturing process forming the feature may be more effectively evaluated.

Figure 1:
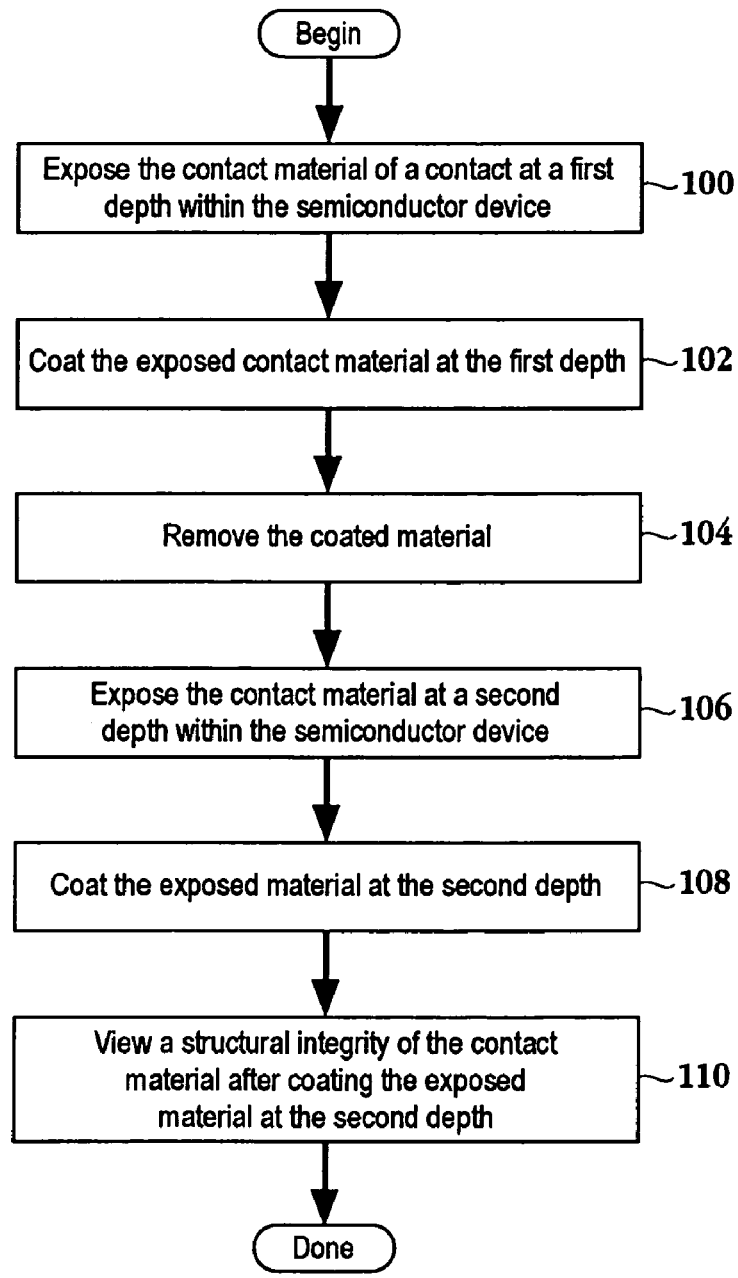
FIG. 1 is a flow chart diagram illustrating the method operations for preparing a cross section of a semiconductor device in a manner that preserves the grain structure of a feature within the semiconductor device for further viewing through a high resolution microscope in accordance with one embodiment of the invention.

FIG. 1 is a flow chart diagram illustrating the method operations for preparing a cross section of a semiconductor device in a manner that preserves the grain structure of a feature within the semiconductor device for further viewing through a high resolution microscope in accordance with one embodiment of the invention. The method initiates with operation 100 where the contact material of a contact is exposed at a first depth within the semiconductor device. Here, a semiconductor device having contacts, vias, interconnects, etc., is cut to a first depth wherein the contact material is exposed. One skilled in the art will appreciate that typical contacts are composed of tungsten. The semiconductor device may be cut by scribing the device and then breaking the device along the scribe line. Through grinding and polishing operations the sample is further prepared for analysis. In one embodiment, the grinding operation is performed by forcing the sample against a diamond lapping film. The polishing operation forces the surface of the sample against a polishing pad in the presence of polishing slurry. The method then advances to operation 102 where the exposed contact material at the first step is coated. Here, the exposed contact material is sputter coated to dispose a conductive layer onto the cut surface that has been processed through the grinding and polishing operations. An exemplary sputter coater used for this operation is described with reference to FIGS. 6A and 6B.

The method then proceeds to operation 104 where the coated material is removed. Here, the coated material may be removed through a grinding operation. As described with reference to operation 100, the first cut of the semiconductor device may be achieved through a grinding and polishing operation where a surface of the exposed material is forced against a diamond lapping film in a first stage, and in a second stage polishing slurries are used to achieve a mirror finish. It should be appreciated that the diamond lapping films are typically associated with a coarseness of 30 to 0.01 microns while the polishing slurries are associated with a particle sizes of approximately 0.05 microns. In one embodiment, the removal of the coated material is achieved through the use of polishing slurry without the use of the diamond lapping films. That is, the polishing is performed for the second cut, but the grinding operation discussed above is not performed with the second cut. The method then moves to operation 106 where the contact material is exposed to a second depth within the semiconductor device. Here, the semiconductor device is cut to a second depth in order to expose the contact material. As will be explained further the thickness of the coated layer is typically about 100 Angstroms, therefore, the second cut, i.e., polishing operation, will remove more than 100 Angstroms in order to remove the coated material as specified in operation 104. It should be further appreciated that operations 104 and 106 may occur simultaneously through the second cut and are listed separately for ease of explanation. The method then advances to operation 108 where the exposed material at the second depth is coated. Here again, the coating process occurs through a sputter coater in order to apply a conductive layer to the exposed material at the second depth. The conductive layer is between about 50 and about 100 Angstroms thick. In one embodiment, the material coated onto the exposed surface is gold palladium. It should be appreciated that any conductive coating may be used here. Other exemplary coatings include tungsten, chromium, and carbon. In another embodiment, the exposed surface of the feature is decorated prior to applying the conductive layer to the exposed material at the second depth. For example, an etch operation may be performed to etch the oxides in order to define a surface topography. As different oxides etch differently, the resulting surface topography will be maintained through the coating operation. Accordingly, this topography may be viewed through scanning electron microscopy. In operation 110 a structural integrity of the contact material is viewed through a suitable microscope after the coating of the exposed material at the second depth. Due to the repeating of the cutting and the coating as described above, the structural integrity, i.e., grain structure, of the contacts are more visible and do not become smeared as illustrated with reference to FIGS. 5A and 5B.

Figure 2:
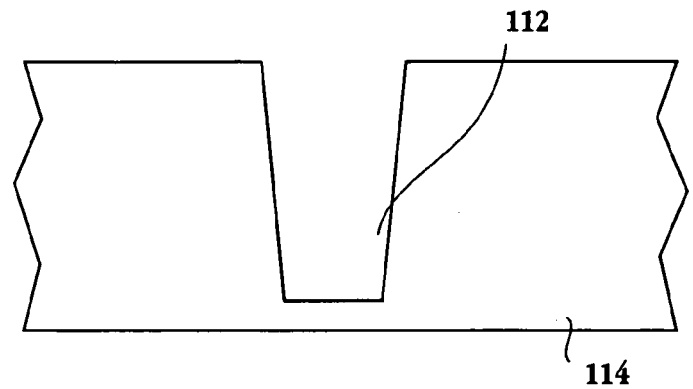
FIG. 2 is a cross section of a layer of a semiconductor device having a feature defined therein.

FIG. 2 is a cross section of a layer of a semiconductor device having a feature defined therein. Here, contact 112 is defined within oxide layer 114. Of course, oxide layer 114 may be a plurality of oxide layers. Contact 112 may also be any number of features which include, a via, a plug, or any other suitable interconnect associated with semiconductor manufacturing. One skilled in the art will appreciate that the interconnects discussed herein are typically composed of tungsten. It should be appreciated that in order to evaluate the effectiveness of the filling of the feature represented by contact 112, the device may be cut and viewed through a stereo scanning microscope in order to check the structural integrity of the material within contact 112. Thus, in order to obtain an accurate picture of the grain structure of the material composing contact 112 the two-cut technique described above with reference to FIG. 1 is employed. It should be appreciated that this technique avoids the use of the hazardous chemicals associated with Reactive Ion Etching.

Figure 3:
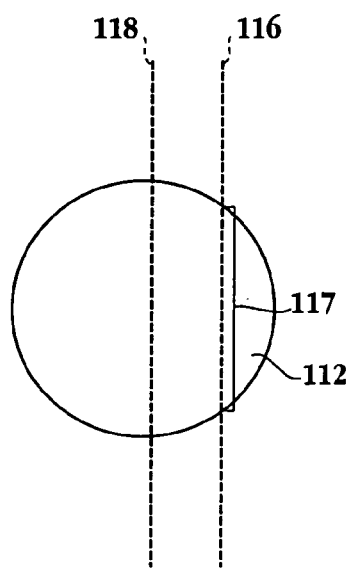
FIG. 3 is a simplified schematic diagram illustrating the two-cut technique that enhances the grain structure for later viewing in accordance with one embodiment of the invention.
Figure 5A:
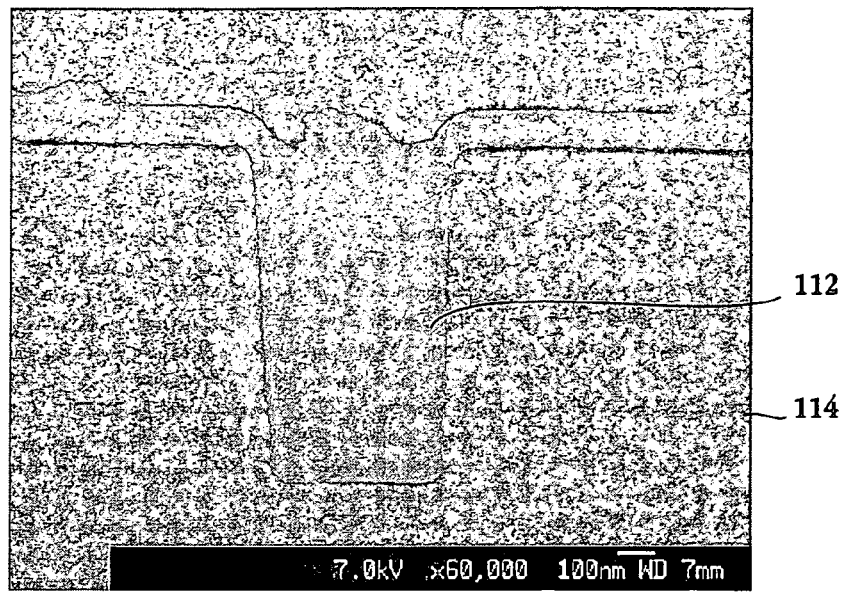
FIGS. 5A and 5B are micrographs that illustrate the effect of the two-cut technique on the viewing capability of a subsequent microscope scan in accordance with one embodiment of the invention.
Figure 5B:
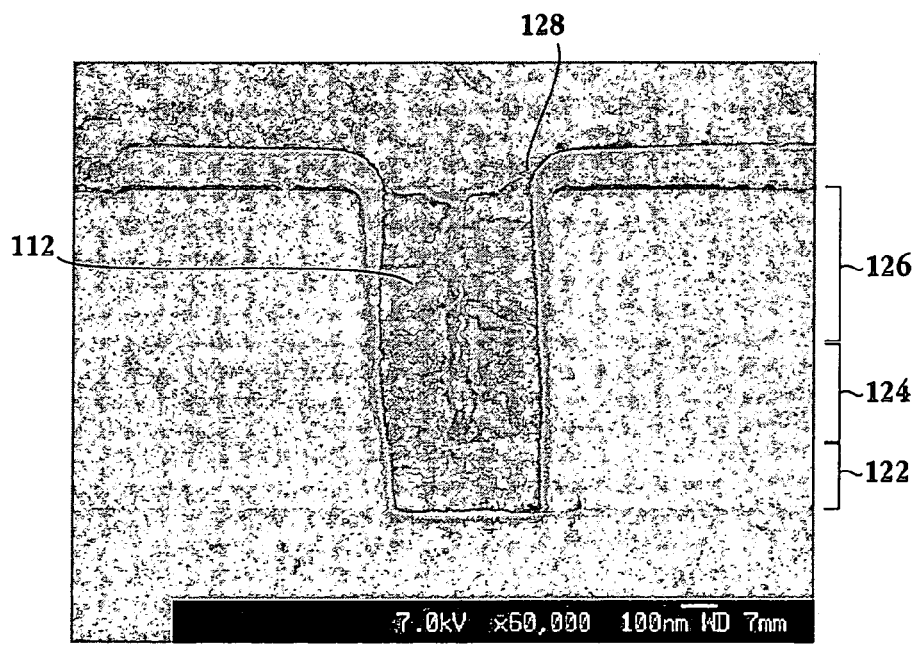

FIG. 3 is a simplified schematic diagram illustrating the two-cut technique that enhances the grain structure for later viewing in accordance with one embodiment of the invention. FIG. 3 represents a top view of contact 112. A grinding and polishing operation cuts into the feature material exposing a surface of the feature material associated with line 116. That is, line 116 represents the cut line, which exposed a surface of feature 112. The surface of feature 112 is represented by portion 117 of cut line 116. The exposed surface, i.e., portion 117, along with the remaining specimen is then sputter coated to apply a conductive layer onto the surface exposed by cut line 116. A second cut is then performed which removes the coated layer and proceeds farther into the feature as represented by cut line 118. Thus, the second cut also exposes a surface of feature 112. This exposed surface is subsequently coated for viewing through a suitable microscope. As shown in FIGS. 5A and 5B, the two step cut method enhances the grain structure so that added information on the process integrity may be gained by the subsequent viewing of the cut.

Figure 4:
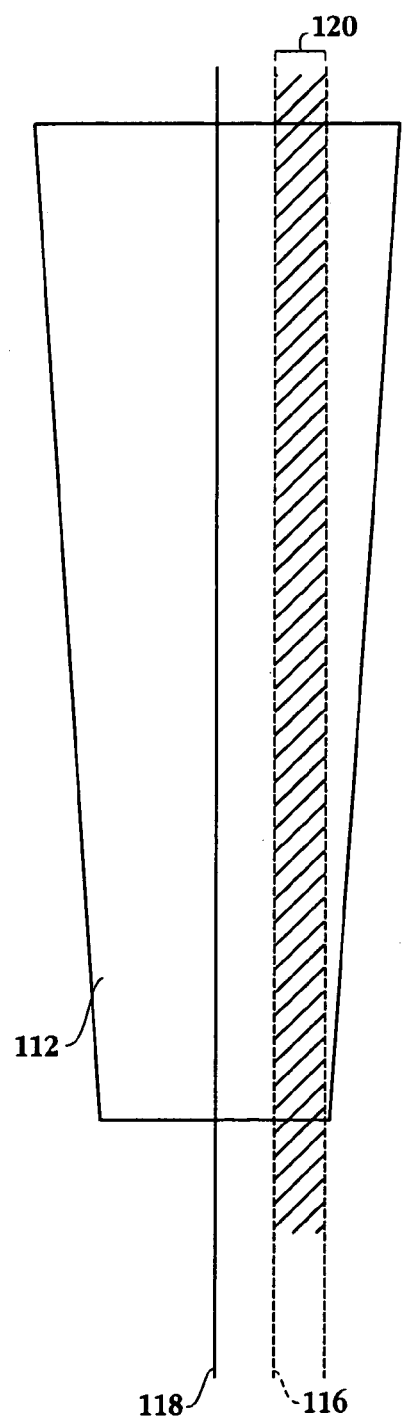
FIG. 4 is a simplified schematic diagram further illustrating the two-cut technique in accordance with one embodiment of the invention.

FIG. 4 is a simplified schematic diagram further illustrating the two-step cut technique in accordance with one embodiment of the invention. FIG. 4 is an enlarged cross-section of contact 112. A first cut along line 116 is made into the feature material of contact 112. The exposed material is then sputter coated with a layer of conductive material, e.g., gold palladium. Layer 120 represents the conductive layer. It should be appreciated that layer 120 has a thickness between about 50 angstroms and about 150 angstroms in one embodiment of the invention. As described above, the first cut is made through a grinding and polishing technique. After the sputter coating operation, a second cut is made into the feature material, which removes the coated layer 120 and proceeds past the first cut 116. The second cut is represented by line 118. The second cut may be achieved by forcing the sample surface against a polishing pad in the presence of a polishing slurry. The exposed material is then treated, i.e., sputter coated with a conductive layer and then viewed through a suitable microscope.

FIGS. 5A and 5B illustrate the effect of the two-cut operation on the viewing capability of a subsequent microscope scan in accordance with one embodiment of the invention. FIG. 5A illustrates the view resulting from a single cut operation. As can be seen the grain structure within feature 112 is not viewable as it is smeared due to the sample preparation technique. Referring to FIG. 5B the resulting view at the same magnification, i.e., 60,000×, shows a far more detailed view of the grain structure within contact 112. Additionally, the various oxide layers may be discerned through the two-cut technique. For example, oxide layers 122, 124 and 126 are clearly shown in FIG. 5B. It should be appreciated that the sample may be decorated after the second cut and before the application of the second coat in order to define the surface topography better to enable viewing of the various oxide layers. In one embodiment, the decorating technique comprises etching the oxide surface to define the surface topography. For example, a chemical wet etch using ammonium fluoride ($NH_4F$) and acetic acid may be applied here. It should be further appreciated that FIG. 5B also enables viewing the integrity of barrier layer 128 defined between feature 112 and the various oxide layers. One skilled in the art will appreciate that barrier layer 128 may be composed of titanium or titanium nitride.

Figure 6A:
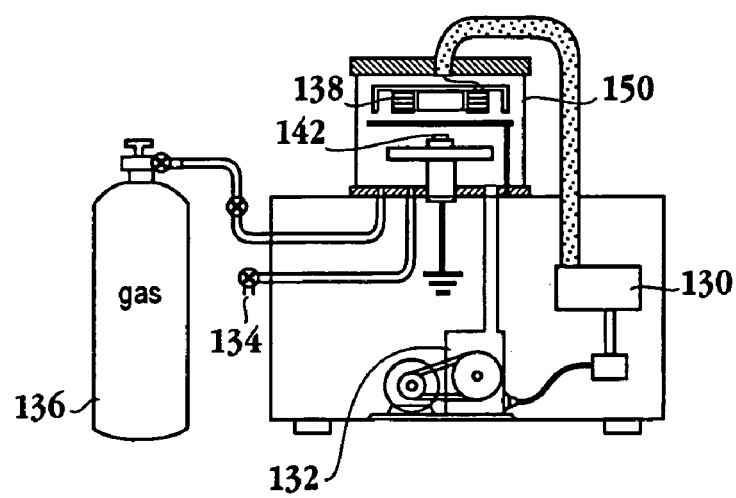
FIGS. 6A and 6B illustrate an exemplary sputter coater in accordance with one embodiment of the invention.
Figure 6B:
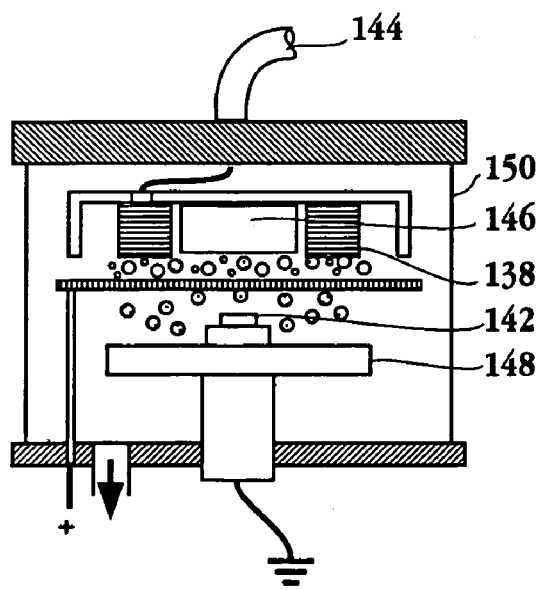

FIGS. 6A and 6B illustrate an exemplary sputter coater in accordance with one embodiment of the invention. FIG. 6A includes the main components of a general sputter coater. Here, specimen 142 is placed onto grounded stage 148. High voltage power supply 130 is coupled to cathode 138 and a high voltage, e.g., 2.5 kV, is applied to the cathode, which may also be referred to as the target. The target is where the coating metal is located. As described above, the coating metal may be any suitable conductive metal such as gold and gold palladium. Inert gas supply is opened to allow a flow of inert gas into chamber 150. The pressure within chamber 150 may be controlled through opening and closing air vent 134. Pump 132 is used to evacuate the chamber prior to starting the sputter coating operation. For example, chamber 150 may be purged several times with the inert gas prior to starting the sputter coating operation. It should be appreciated that the inert gas may be argon in one embodiment of the invention.

FIG. 6B is an expanded schematic diagram of the chamber of the sputter coater of FIG. 6A. High voltage supply line 144 is coupled to cathode 138. The ionized inert gas, e.g., argon, molecules are attracted to the metal target (cathode) because of its negative charge, thereby causing the release of metal atoms which travel in a random path. Those atoms that strike specimen 142 result in a thin coating of the metal target material being disposed over the surface of the specimen. A permanent magnet 146 deflects electrons, which would otherwise damage the specimen surface. One skilled in the art will appreciate that further protection for specimen 142 may be achieved by supplying cooling through stage 148.

In summary, the above-described invention provides a method and apparatus for enhancing the grain structure of a feature material in order to evaluate the integrity of the feature and the process that formed the feature. By applying a coating layer through a voltage potential driven energy after exposing a surface of the feature and then removing the deposited layer and cutting further into the feature material, the grain structure is preserved for viewing. It should be appreciated that while an exemplary sputter coater is described above, the invention is not limited to that particular sputter coater. That is, any suitable apparatus for depositing the coated layer onto the exposed surface through the use of a voltage potential driven energy may be used.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for enhancing grain structure of a contact material for a semiconductor device, comprising method operations of:
    exposing the contact material of a contact at a first depth within the semiconductor device;
    coating the exposed contact material at the first depth;
    removing the coated material;
    exposing the contact material at a second depth within the semiconductor device; and
    coating the exposed material at the second depth.

2. The method of claim 1, wherein the method operation of exposing the contact material of a contact at a first depth within the semiconductor device includes,
    grinding a surface of the semiconductor device; and
    polishing the surface.

3. The method of claim 2, wherein the method operation of polishing the surface includes,
    applying a polishing slurry having a particle size of about 0.05 microns to the surface.

4. The method of claim 1, wherein the method operation of coating the exposed contact material at the first depth includes,
    sputter coating a conductive layer onto the exposed contact material at the first depth.

5. The method of claim 1, wherein the method operation of coating the exposed contact material at the first depth includes,
    applying a gold palladium layer having a thickness of between about 50 Angstroms and about 150 Angstroms.

6. The method of claim 1, further comprising:
    viewing a structural integrity of the contact material after coating the exposed material at the second depth.

7. The method of claim 1, wherein the method operation of coating the exposed contact material at the first depth includes,
    applying a conductive layer to the exposed contact material via a voltage potential driven energy.

8. The method of claim 1, wherein the contact material is tungsten.

* * * * *